(12) United States Patent
Raz (10) Patent No.: US 10,371,766 B2
(45) Date of Patent: Aug. 6, 2019

(54) SYSTEMS AND METHODS FOR IMPROVING THE FUNCTIONALITY OF OPTICALLY PUMPED MAGNETOMETER IN SELF-OSCILLATING MODE

(71) Applicant: GEOTECH LTD., Aurora (CA)

(72) Inventor: Ryan S. Raz, Aurora (CA)

(73) Assignee: GEOTECH LTD. (CA)

( * ) Notice: Subject to any disclaimer, the term of this patent is extended or adjusted under 35 U.S.C. 154(b) by 0 days.

(21) Appl. No.: 15/525,554

(22) PCT Filed: Nov. 9, 2015

(86) PCT No.: PCT/CA2015/051159
§ 371 (c)(1),
(2) Date: May 9, 2017

(87) PCT Pub. No.: WO2016/074076
PCT Pub. Date: May 19, 2016

(65) Prior Publication Data
US 2018/0292474 A1 Oct. 11, 2018

Related U.S. Application Data

(60) Provisional application No. 62/090,647, filed on Dec. 11, 2014, provisional application No. 62/077,506, filed on Nov. 10, 2014.

(51) Int. Cl.
*G01R 33/26* (2006.01)
*G01V 3/165* (2006.01)
*G01V 3/16* (2006.01)

(52) U.S. Cl.
CPC .............. *G01R 33/26* (2013.01); *G01V 3/16* (2013.01); *G01V 3/165* (2013.01)

(58) Field of Classification Search
CPC .......... G01R 33/26; G01V 3/16; G01V 3/165
See application file for complete search history.

(56) References Cited

U.S. PATENT DOCUMENTS

| | | | | |
|---|---|---|---|---|
| 3,577,068 A * | 5/1971 | La Force | ............... | G01R 33/26 324/301 |
| 5,059,783 A * | 10/1991 | Stranjord | ............ | G01R 33/032 250/227.19 |
| 5,245,280 A * | 9/1993 | Beranger | ............... | G01R 33/26 324/302 |
| 6,472,869 B1 * | 10/2002 | Upschulte | ............. | G01R 33/26 324/300 |
| 7,592,878 B2 * | 9/2009 | Fagg | ....................... | H03B 5/06 331/186 |
| 8,736,324 B2 * | 5/2014 | Wong | .................... | H03L 7/0995 327/147 |

(Continued)

*Primary Examiner* — Tung X Nguyen
*Assistant Examiner* — Dominic E Hawkins
(74) *Attorney, Agent, or Firm* — Polsinelli PC (57) ABSTRACT

A method and system that includes injecting light into a vapor cell; detecting an output of the light from the vapor cell; modulating the light injected into the vapor cell in dependence on the detected output to achieve an oscillating signal; applying an energy pulse to the vapor cell prior to achieving the oscillating signal to decrease a time required to achieve the oscillating signal; and determining a magnetic field measurement in dependence on a frequency of the oscillating signal.

22 Claims, 12 Drawing Sheets

(56) References Cited

U.S. PATENT DOCUMENTS

| | | | |
|---|---|---|---|
| 2009/0001979 A1* | 1/2009 | Kawabata | G01R 33/032 324/244.1 |
| 2010/0232460 A1* | 9/2010 | Canham | H01S 3/0387 372/25 |
| 2011/0025323 A1* | 2/2011 | Budker | G01R 33/26 324/304 |
| 2013/0214780 A1* | 8/2013 | Smith | G01N 24/006 324/304 |
| 2013/0342210 A1* | 12/2013 | Stokely | G01R 33/26 324/346 |
| 2014/0247045 A1* | 9/2014 | Kornack | G01R 33/26 324/304 |

* cited by examiner

FIG. 14 ered, being measured in FIG. 1.

SYSTEMS AND METHODS FOR IMPROVING THE FUNCTIONALITY OF OPTICALLY PUMPED MAGNETOMETER IN SELF-OSCILLATING MODE

CROSS-REFERENCE TO RELATED APPLICATIONS

This application is a national stage entry of PCT/CA2015/051159 filed Nov. 9, 2015, which claims the benefit of and priority to U.S. Provisional Patent Application No. 62/077,506 filed Nov. 10, 2014 and U.S. Provisional Patent Application No. 62/090,647 filed Dec. 11, 2014, the contents of each if the applications, in the entirely, are incorporated herein by reference.

FIELD

This disclosure relates to optically pumped magnetometer systems and methods for improving the recovery time of such systems in oscillating mode.

BACKGROUND

Self-oscillating atomic/nuclear magnetometers are used as scalar magnetometers when high sensitivity, accurate, reliable, high rate of change tracking and stable operation are needed. An optically pumped magnetometer measures the Larmor precession frequency of a vapor sample of spin polarized atoms in an external magnetic field. The measured frequency is used to generate a signal that corresponds to the external magnetic field.

SUMMARY

According to example embodiments is a method that includes injecting light into a vapor cell; detecting an output of the light from the vapor cell; modulating the light injected into the vapor cell in dependence on the detected output to achieve an oscillating signal; applying an energy pulse to the vapor cell prior to achieving the oscillating signal to decrease a time required to achieve the oscillating signal; and determining a magnetic field measurement in dependence on a frequency of the oscillating signal.

According to an example embodiment, there is provided an apparatus that includes a vapor cell containing an alkali vapor, a light source for injecting light into the vapor cell and a a detector for detecting an output of the light from the vapor cell. The device also includes a modulating device for modulating the light injected into the vapor cell in dependence on the detected output to achieve an oscillating signal, and a driver for applying an energy pulse to the vapor cell prior to achieving the oscillating signal to decrease a time required to achieve the oscillating signal. A magnetic field measurement is represented by a frequency of the oscillating signal.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
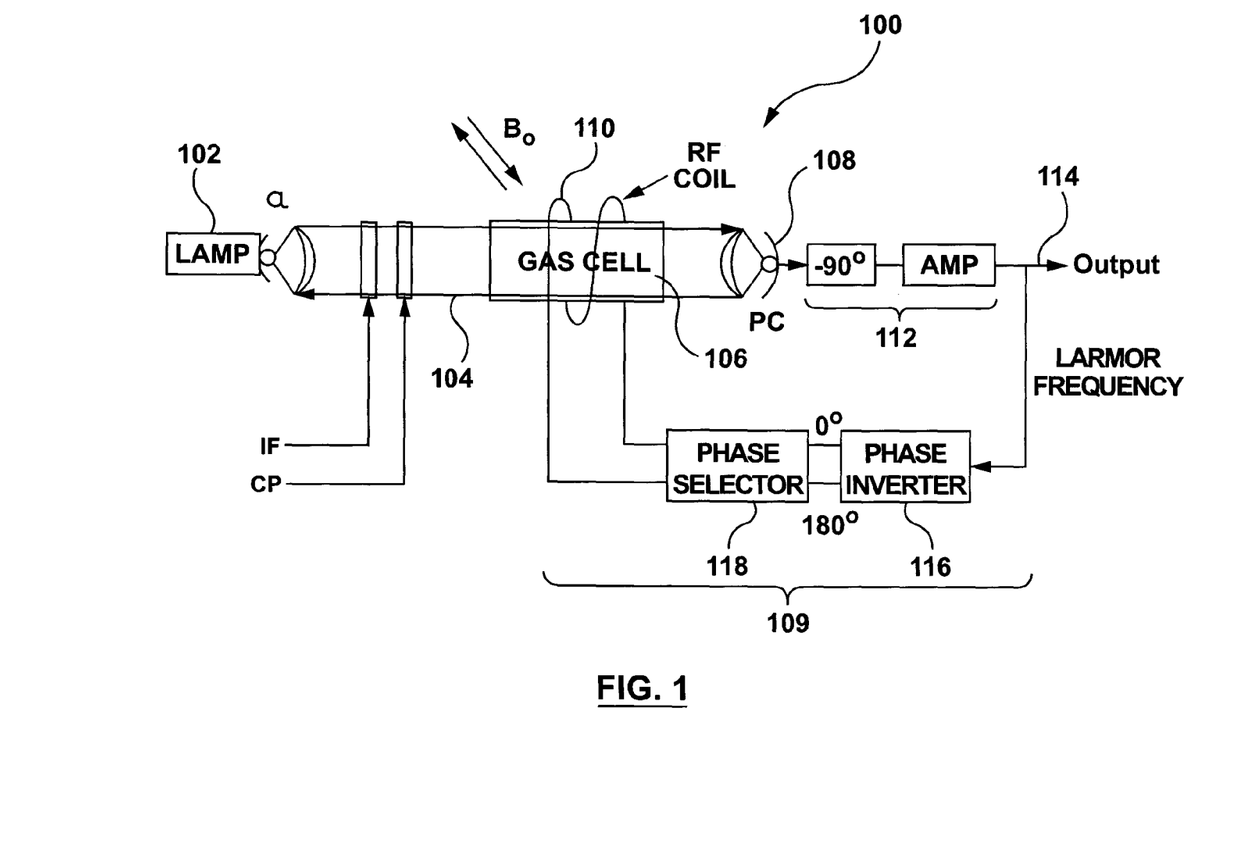
FIG. 1 is a schematic of a self-oscillating magnetometer.

FIG. 1 illustrates a self-oscillating magnetometer 100 which can be modified as described herein according to example embodiments. The magnetometer 100 is an optically pumped alkali metal vapor magnetometer. In example embodiments the alkali vapor is cesium; however other alkali vapors could be substituted in some applications, including for example rubidium or potassium. The magnetometer 100 includes a light emitter or lamp 102 for emitting photons, a vapor cell or chamber 106 containing cesium vapor through which the emitted photons pass, and a photo diode or optical sensor 108 for detecting photons, arranged in that order.

As shown in FIG. 1, the vapor cell 106 is positioned in a light guide 104 that includes a first lens, interference filter (IF) and a circular polarizer (CP) between the light emitter or lamp 102 and the vapor cell 106, and a second lens in front of the photo cell (PC) of the optical sensor 108. $B_o$ denotes the external magnetic field that is being measured in FIG. 1. As known in the art, the basic principle that allows the magnetometer 100 device to operate is the shifting of electrons in a cesium atom between three different energy level states, referred to as level 1, level 2 and level 3. The vapor contained in cell 106 is exposed (or pumped) by light injected from lamp 102 having a wavelength that has been selected to cause light polarization. When a cesium atom within the vapor cell or chamber 106 encounters a photon from the lamp 102, it is excited from a level 2 to a level 3 state. The level 3 state is not maintained and these electrons spontaneously disable to both energy levels 1 and 2. Eventually, through this process all electrons within the vapor chamber 106 will be at energy level 1, at which time the vapor in the chamber 106 becomes transparent and stops absorbing polarizing light such that photons from the lamp 102 will pass through vapor cell 106 unhindered and be measured by the photon detector 108. At this point, the vapor sample (or population) is said to be polarized.

In the self-oscillating magnetometer of FIG. 1 includes a feedback circuit 109 that uses the signal generated at magnetometer output 114 to modulate light passing through the vapor cell 106. In this regard, feedback circuit 109 includes a modulating device in the form of RF coil 106, a phase selector 118 and a phase inverter 116 connected to output node 114, such that the RF coil 106 provides a very small AC magnetic field to the cell 106. RF coil 106 is used to depolarize the vapor contained in cell 106. In particular RF power corresponding to the energy difference between levels 1 and 2 is applied to the cell 106 to move the electrons from level 1 back to level 2, at which energy level the electrons can again absorb photons from lamp 102, causing the cell 106 to become opaque. The frequency of the RF field required to repopulate level 2 varies with the external magnetic field $B_o$ and is called the Larmor frequency. The polarization and depolarization results in modulation of the light passing through cell 106, causing a corresponding signal on the optical sensor 108 that measures the light passing through the cell 106. An output circuit 112 uses this fact to create a signal at output node 114 at the frequency which corresponds to the external magnetic field $B_o$, namely the Larmor frequency. Thus, by detecting how light is modulated as it passes through the vapor cell 106 and measuring the frequency of the modulating signal applied by the RF coil 110, an output 114 can be generated that correlates to a measurement for external field $B_o$.

In an alternative magnetometer configuration to that shown in FIG. 1, the phase selector 118 and phase inverter 116 of the feedback circuit 109 can be replaced with a lock-in amplifier. Some advantages of a lock-in amplifier magnetometer over a self-oscillating magnetometer is that the amplifier can be used to filter out noise (including environmental noise). Disadvantages are that (i) the lock-in amplifier needs to search for the Larmor frequency which takes a considerable amount of time to lock; and (ii) a lock-in amplifier magnetometer has at least an order of magnitude less bandwidth then required to track rapidly changing magnetic fields.

In at least some example embodiments, the magnetometers described herein are intended to be used in mobile geophysical surveying applications. By way of example, two or more magnetometers can be combined to provide a magnetic sensor or gradiometer that is suspended from or mounted to an aircraft and used for airborne geophysical surveying. In a mobile environment, both self-oscillating and lock-in amplifier optically pumped magnetometers can be adversely affected in at least two commonly occurring operating conditions. Firstly, when subjected to one or both of high local gradients and strong transient fields, self-oscillating magnetometers can stop oscillating and lock-in amplifier magnetometers can lose lock. By way of example, such a situation can occur if a magnetometer is close to a high field strength EM transmitter, such as in a a time domain electromagnetic (TDEM) surveying system or when an airborne sensor flies over a high power transmission line. The second adverse condition can occur when the external magnetic field is orthogonal or parallel to the axis of the magnetometer. In particular, optically pumped magnetometers experience dead zones in which the angular region of the magnetometer orientation produces poor or no measurements. Such dead zones are prevalent in equatorial regions and can be of particular concern in the case of a magnetometer that is used for mobile measurements, such as an airborne magnetometer used for geophysical surveying.

As noted above, self-oscillating magnetometers have faster off/on cycling than lock-in amplifier magnetometers, however self-oscillating magnetometers can still take an impractical amount of time to start oscillating. For example, the start time could vary unpredictably from 1.5 ms to a period of a few milliseconds depending on conditions. During this start time, the magnetometer output is unsuitable for precision magnetic field measurements. Accordingly, both self-oscillating and lock-in amplifier magnetometers face operational deficiencies in environments where the magnetometer is expected to frequently lose oscillation or has to be cycled off and on at a rate greater than a few hertz.

Example embodiments are described herein in which the magnetometer 100 of FIG. 1 is modified to militate against one or more of the adverse operating conditions noted above. In this regard, embodiments described herein relate to systems and methods to facilitate early start of an optically pumped magnetometer. In some example embodiments, a short kicker or initialization pulse, which could be an RF or optical pulse is applied to the vapor cell 106 to cause self-oscillation to begin within one-cycle of the Larmor frequency, thus allowing measurement of the magnetic field to begin at the start of the next cycle. In example embodiments, a magnetometer configured according to the methods and systems described herein has a start-up time of 10 microseconds for a cesium magnetometer operating in a 50,000 nT field, and operates at 500 Hz with a 50% duty cycle. In example embodiments, the start-up time is consistent with and linked to the Larmor frequency.

Figure 2:
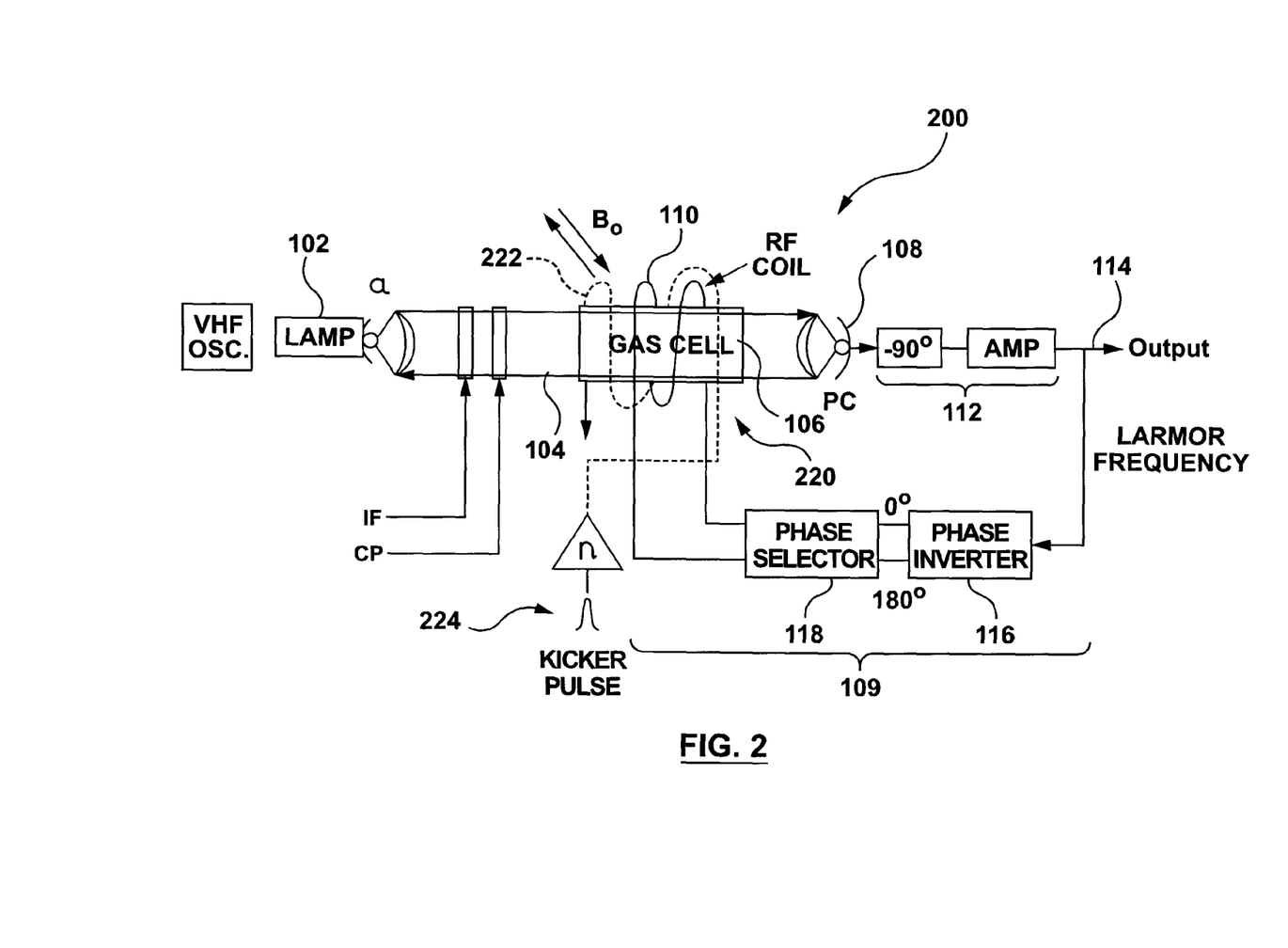
FIG. 2 is a schematic of a self-oscillating magnetometer according to an example embodiment.

As noted above, in example embodiments a short kicker pulse is applied to the magnetometer cell 106 using either an RF coil or an optical pulse generator. In the case of an RF pulse, the pulse can be applied through an independent RF coil secured to an existing magnetometer structure, or through the existing RF coil 110. In this regard, FIG. 2 illustrates a modified magnetometer 200 that is similar to magnetometer 100 except that a kicker pulse circuit 220 has been added to the configuration. Such a configuration allows a short pulse to be injected into an existing magnetometer setup. The kicker pulse circuit 220 includes driver n and an additional independent RF coil 222 surrounding vapor cell 106. The driver n is used to apply a short pulse 224 to the RF coil 222 surrounding cell 106.

In an example embodiment, the short pulse 224 that is applied has a duration that is less than half of the cycle width of the Larmor frequency signal. In an example embodiment, the front end of the pulse 224 has a wide frequency spectrum, as shown for example in FIG. 8, such that sufficient energy early in the pulse 224 lies within the frequency band of the Larmor transition line to provide electrons in the vapor cell 106 with sufficient energy to raise the electrons to unstable energy level 3 such that they will drop down to a lower energy level. The transition to a lower energy state cause the optical sensor 108 to see a change in intensity at the Larmor frequency. Because the vapor cell 106 is maximally pumped to equilibrium, the short pulse 224 creates a strong signal at the sensor 108, effectively kick starting the oscillation. This phenomenon is very similar to ringing a bell using a short impulse function.

Figure 8:
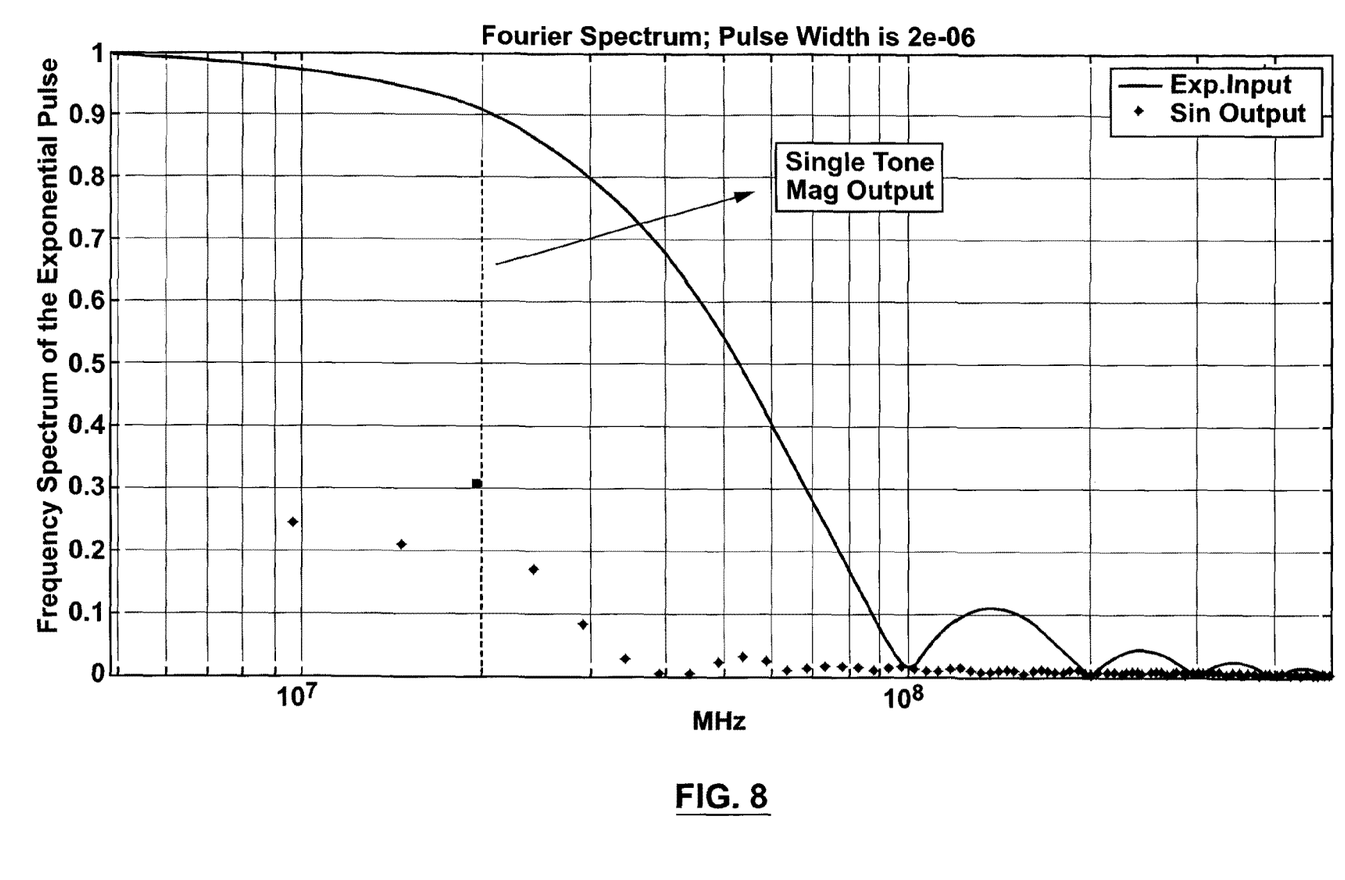
FIG. 8 illustrates the power spectrum of the pulse of FIG. 7.

In an example embodiment, the front edge of the short pulse 224 is modeled with an exponential function as shown in FIG. 8 and has a broad band power spectrum that covers the operating range of the magnetometer 200. The pulse 224 is applied to vapor cell 106 when the electrons in the cell 106 are already pumped to a sufficiently high state by lamp 102 so that only a small additional amount of power at the Larmor frequency is required to bump the electrons up to level 3, from which they inherently transition down to a lower state, resulting in the increased signal at the optical sensor 108 sufficient to initiate oscillation. Alternative edge shapes could be used for pulse 224 so long as they have the necessary power density spectrum to initiate oscillation.

In example embodiments the short pulse 224 is short enough (less than ½ cycle of the Larmor frequency) to prevent the downward edge of the pulse from causing any de-phasing of the oscillation. Polarity of the short pulse 224 is important in at least some examples as reversing polarity will not work as effectively. In example embodiments, the correct polarity is related to the geometry of the magnetometer, the direction of the polarization in the cell 106, and the direction of the ambient magnetic field vector.

Figure 3:
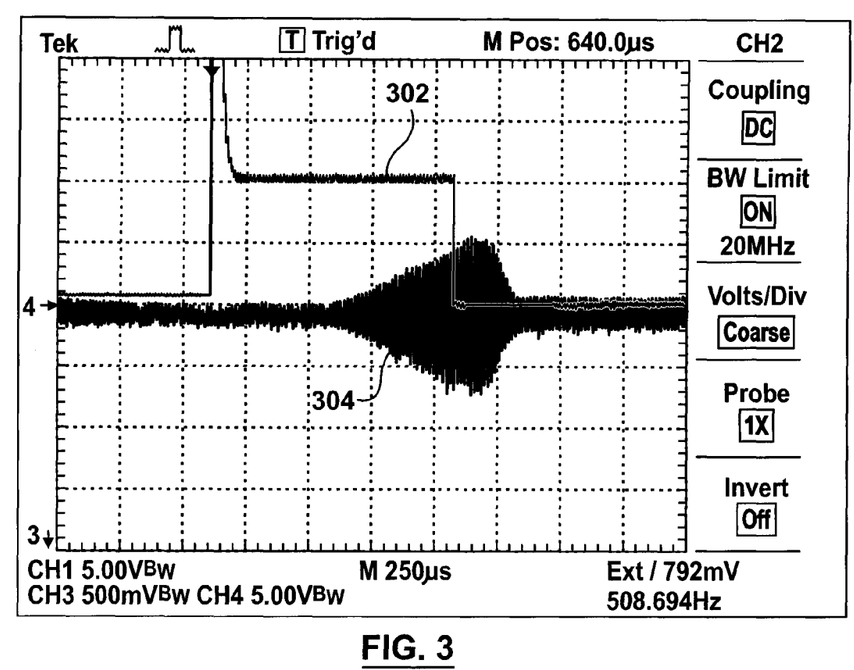
FIG. 3 shows a representation of signals input to and output from a conventional magnetometer such as that shown in FIG. 1.
Figure 4:
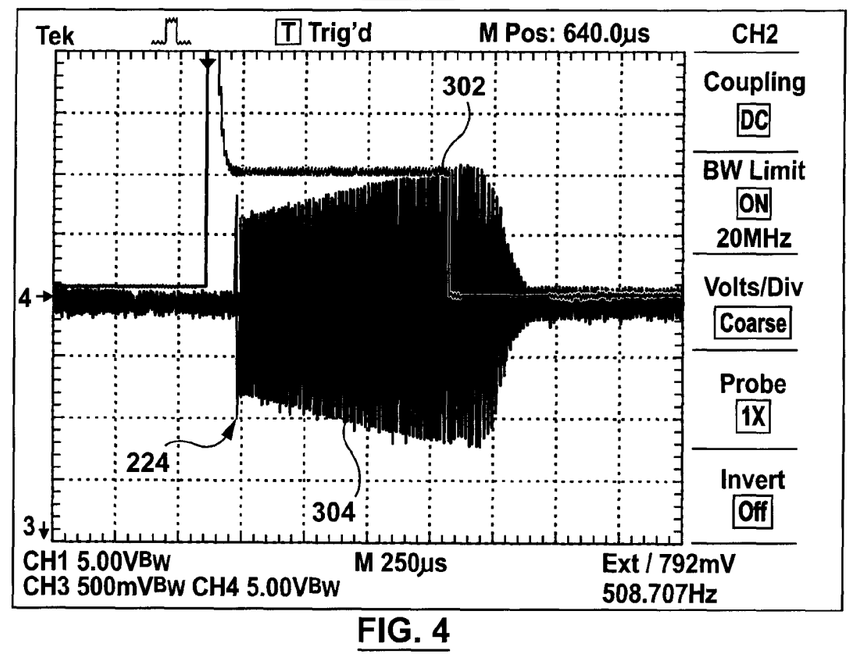
FIG. 4 shows a representation of signals input to and output from a magnetometer that includes a kicker pulse circuit such as shown in FIG. 2.
Figure 5:
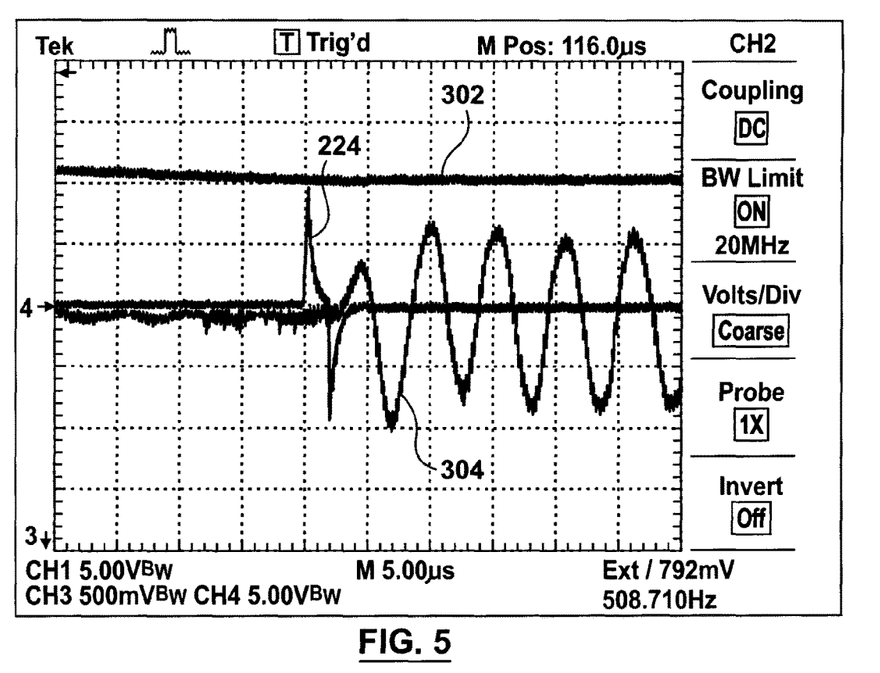
FIG. 5 is a larger scale view of FIG. 4.

In order to facilitate an understanding of the described embodiments, oscilloscope screen shots are shown in FIGS. 3 and 4 that represent the operation of a magnetometer in which no kicker pulse is applied to the magnetometer cell 106 (FIG. 3) and where a kicker pulse such as pulse 224 is applied to the magnetometer cell 106 (FIG. 4). In each of FIGS. 3 and 4, the pulse shown by line 302 represents a magnetic field applied to the magnetometer cell 106—when the pulse 302 is low, the magnetic field applied to the cell 106 is "on" and puts the magnetometer into a dead zone where it cannot operate; when the pulse 302 is high (as seen in the center regions of FIGS. 3 and 4), the applied magnetic field is removed ("off"), allowing the magnetometer to exit the dead zone. In FIG. 3, the magnetometer output signal 304 fails to start oscillating until late into pulse 302. In FIG. 4, the kicker pulse 224 is applied to coil 222 soon after the pulse 302 is high (e.g. soon after the dead zone is exited), and is immediately followed by an oscillating output 304. FIG. 5 illustrates the screen shot of FIG. 4 scaled to show that the output 304 starts oscillating before the 2.0 microsecond kicker pulse 224 is complete. Accordingly the application of the kicker pulse 224 is able to substantially speed up initialization of oscillation at the Larmor frequency upon exiting a dead zone.

Figure 6:
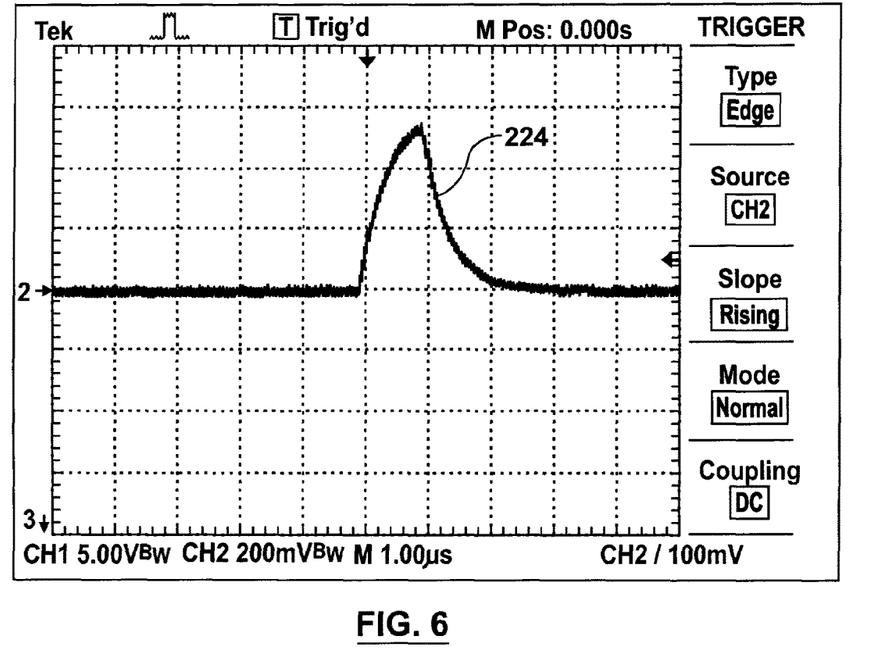
FIG. 6 shows a current value of the kicker pulse that is shown as a voltage value in FIGS. 4 and 5.

FIG. 6 illustrates the shape of the kicker pulse 224 as a current through the RF coil 222 rather than at the driver n as a voltage as is illustrated in FIGS. 4 and 5. The kicker pulse is proportional to the size of the current rather than voltage.

Figure 7:
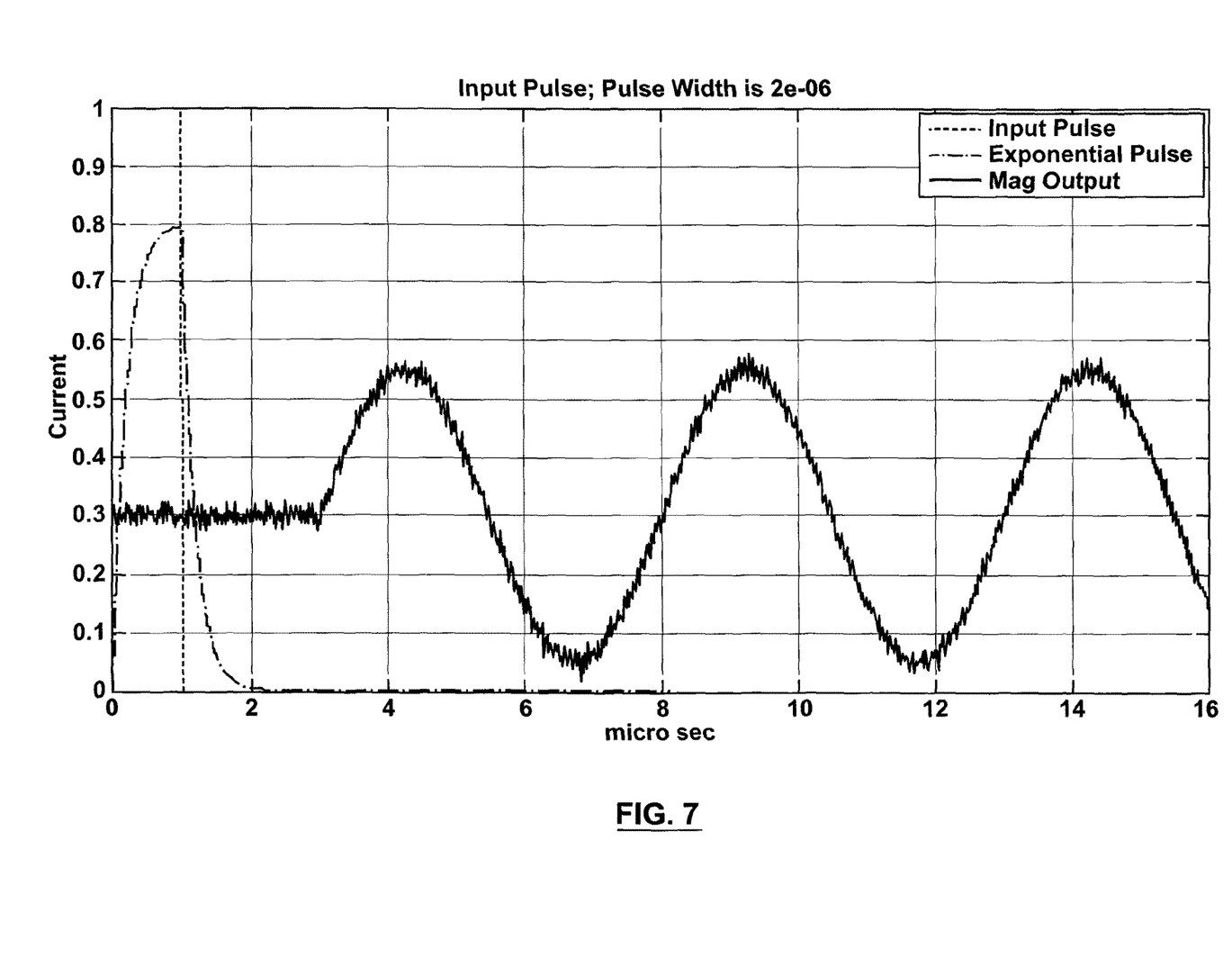
FIG. 7 illustrates a model of a current/time plot of a kicker pulse.

FIG. 7 illustrates a model of a current/time plot of a kicker pulse, and the power spectrum of the pulse of FIG. 7 is shown in FIG. 8. As noted above, the pulse has a broadband power spectrum and includes components within the whole frequency operating range of the magnetometer.

Figure 9:
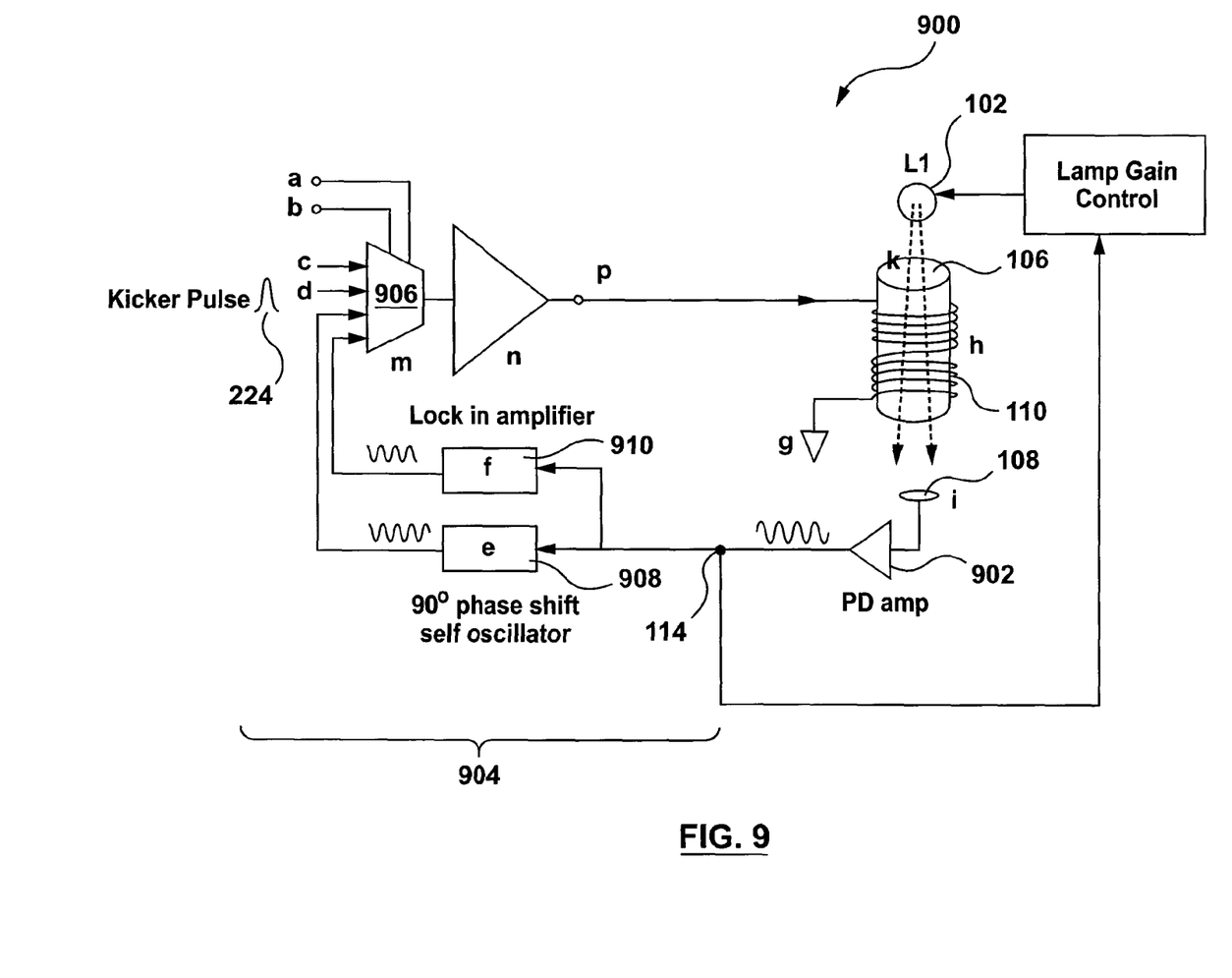
FIG. 9 is a schematic of a self-oscillating magnetometer according to a further example embodiment.

The magnetometer embodiment of FIG. 2 uses an additional RF coil 222 to inject the short pulse 224 to the magnetometer cell 106. However, in alternative embodiments, the same RF coil 110 used to apply the feedback signal to the cell 106 is also used to apply the short kicker pulse 224. In this regard FIG. 9 is a schematic of an example embodiment of a magnetometer 900 that has the kicker pulse 224 fed to the magnetometer cell 106 by using the feedback RF coil 110 such that an extra RF coil is not required. The magnetometer 900 also is configured to operate in either a self-oscillating mode or in a hybrid mode in which the feedback signal from is applied to lock-in amplifier to speed up lock time. The hybrid mode may in some applications make use of any benefits that a non-self oscillating lock-in amplifier magnetometer may have (which as noted above can include improved noise filtering), while at the same time providing a quicker lock in time.

As seen in FIG. 9, magnetometer 900 includes conventional magnetometer components of a lamp 102, a vapor chamber 106 surrounded by RF coil 110, photo diode/optical sensor 108, photo diode amp 902, and output node 114. However, in magnetometer 900, feedback and kicker pulse circuits are integrated into a combined circuit 904, which includes a multiplexer switch 906 whose output to RF coil driver n is controlled by input selection lines a and b. The inputs to multiplexer 906 include a clamp input c that, while asserted, keeps the vapor cell 106 in a continuously pumped state so that subsequent application of the kicker pulse 224 at multiplexer input d will cause a large response. The multiplexor 906 also includes an input connected to output node 114 through self-oscillating circuitry 908 that includes a 90 degree phase shifter e for providing the feedback to RF coil 110 required for self-oscillating operation. In an example embodiment, a parallel path from the output node 114 to the multiplexer 906 is provided through a lock-in amplifier 910 to enable the hybrid operating mode described above.

Accordingly, during operation of the magnetometer 900 the multiplexer 906 can be controlled to apply the kicker pulse 225 to the RF coil 110 as the magnetometer leaves a dead zone, and then immediately switched to apply the feedback signal from self-oscillating circuitry 908 in order to initiate self-oscillation in the manner described above.

As known in the art, in some self-oscillating alkali vapor scalar magnetometer configurations (for example Bell-Bloom magnetometers) the light applied to vapor cell 106 is modulated as an alternative to using a field applied though RF coil 110. In example embodiments, the kicker pulse methods described above can also be applied to Bell-Bloom style magnetometers, and in this regard FIGS. 10 and 11 show two different Bell-Bloom magnetometer configurations that have been modified to allow a kicker pulse 224 to be applied to accelerate the start of self-oscillation.

Figure 10:
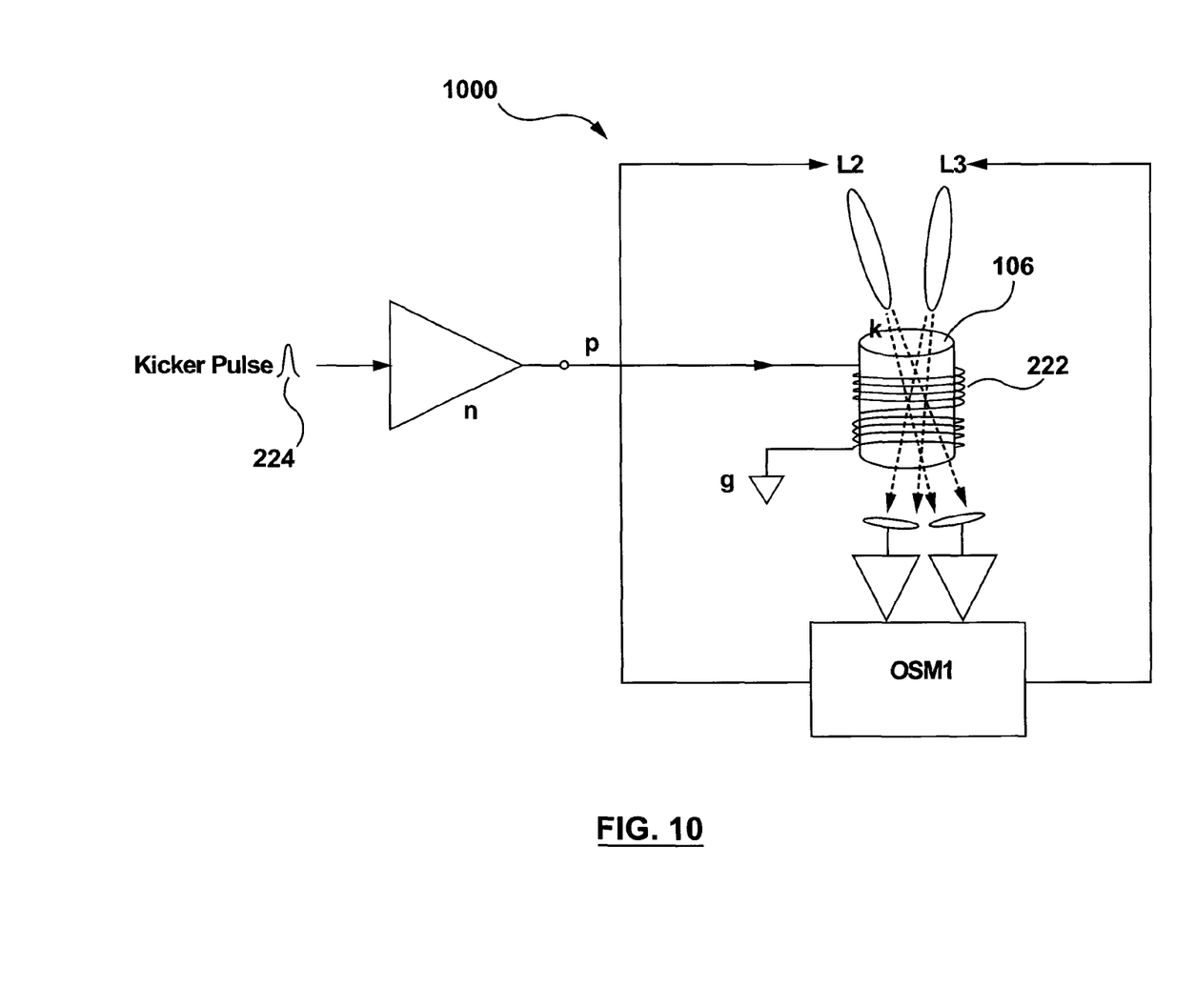
FIG. 10 is a schematic of another self-oscillating magnetometer according to a further example embodiment.
Figure 11:
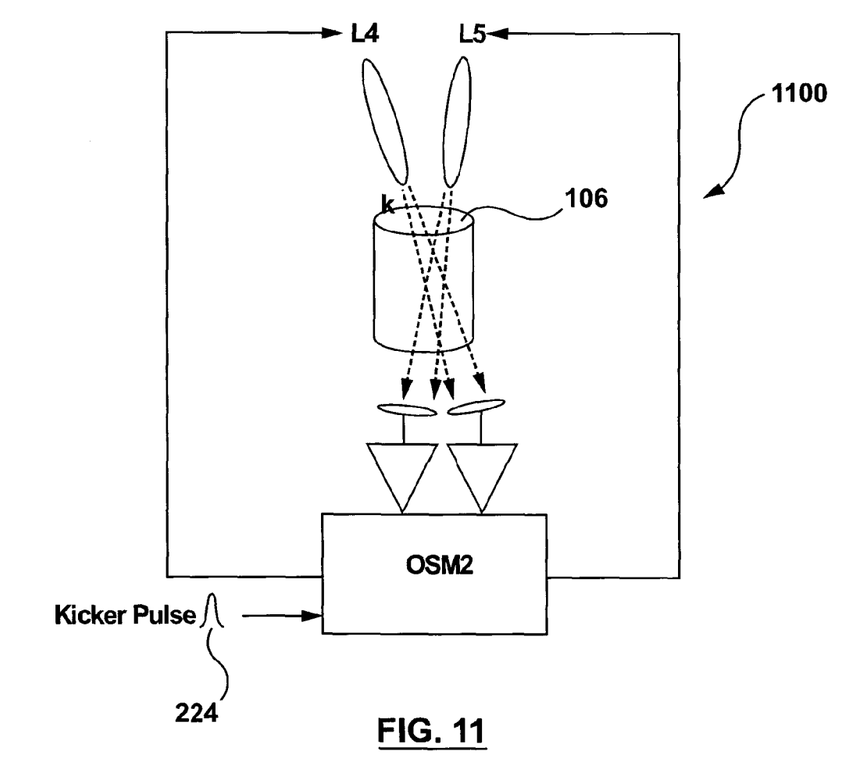
FIG. 11 is a schematic of still another self-oscillating magnetometer according to a further example embodiment.

In particular, FIG. 10 shows an example embodiment of a Bell-Bloom magnetometer 1000 that includes pump and pulse beam sources L2 and L3 and associated receivers. Pump beam source is used as a modulating device to depolarize the vapor. The magnetometer 1000 varies from a conventional optically modulated magnetometer in that RF coil 222 has been added along with coil driver n for the purpose of applying kicker pulse 224 to the vapor cell 222. FIG. 11 shows an example embodiment of a Bell-Bloom magnetometer 1100 that is similar to that of FIG. 10 except that the kicker pulse 224 is applied as an optical pulse rather than as an RF pulse, which could be used for example to provide a quick change in beam polarization.

Figure 12:
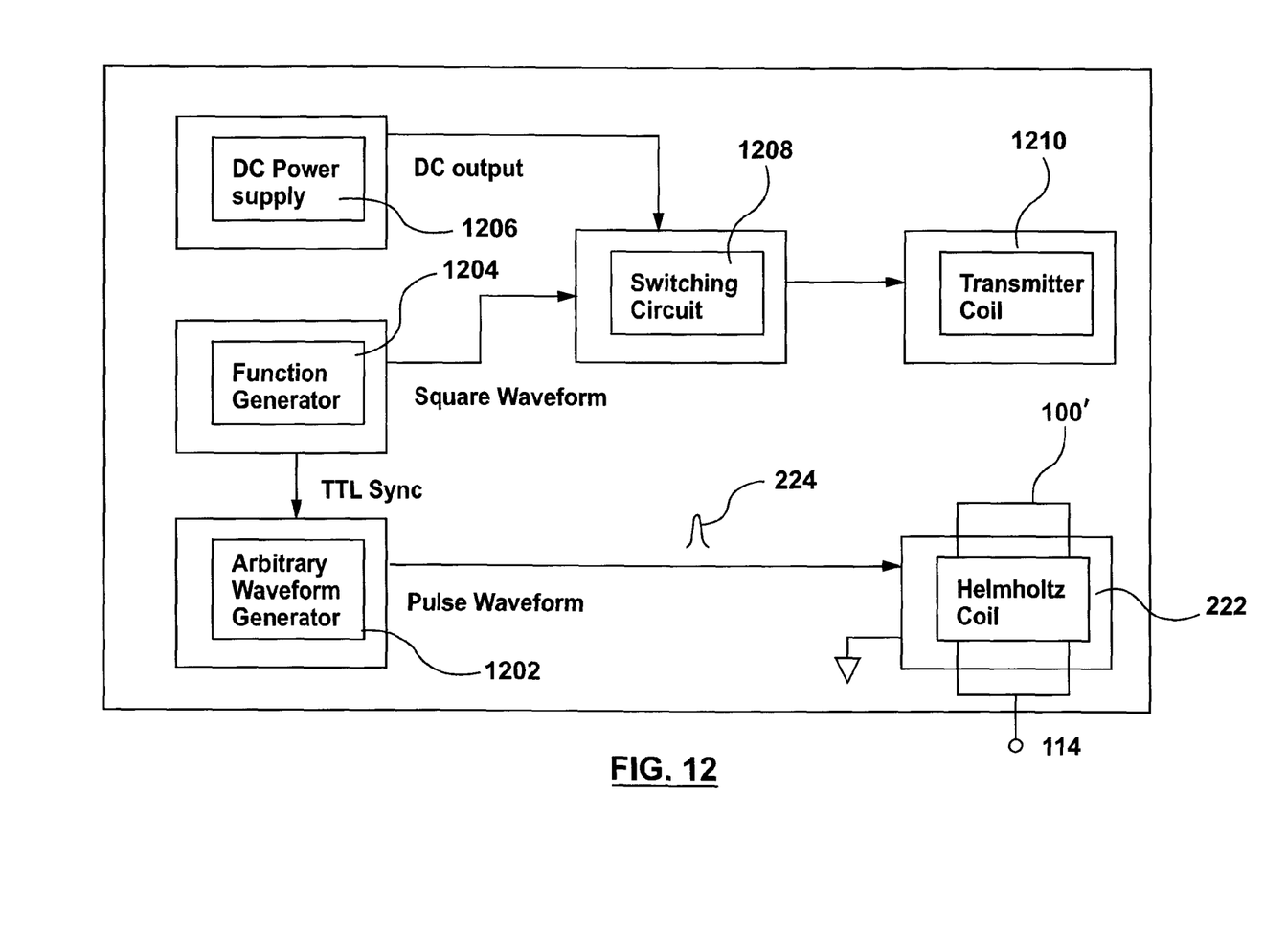
FIG. 12 illustrates a test setup and possible application of a magnetometer according example embodiments.

An experimental test setup is shown in FIG. 12 that incorporates aspects of the embodiments set out above will now be described in order to facilitate a further understanding. The test setup up FIG. 12 was applied to an existing magnetometer device 100' so that no internal modification of the existing magnetometer device was required. The magnetometer device 100' used in the test setup was a G-823 Cesium Magnetometer from Geometrics™, which outputs a sine wave at Larmor Frequency.

The test setup included an external RF coil 222 that was secured a housing of the magnetometer 100' to allow a kicker pulse 224 to be applied. In the test setup, the RF coil 222 was a Helmholtz coil, which includes a pair of identical coils wound in the same direction and separated by a distance to produce a substantially homogenous magnetic filed in the mid-plane between the two coils. An arbitrary waveform generator 1202 (Agilent™ 33120A15) was used to create the kicker pulse 224. A function generator 1204 (Leader™ LFG-1310) was used to TTL signal to gate the arbitrary waveform generator 1202 and a square waveform to gate switching circuit 1208, which was used to control the current from a power supply 1206 going to a transmitter coil 1210. The transmitter coil 1210 was used to generate an electromagnetic field pulse to drive the magnetometer 100' into a simulated dead zone. Thus, during operation, the function generation 1204 synchronized the operation of the pulse 224 applied to Helmholtz coil 222 and the signal used to drive transmitter coil 1210.

Figure 13:
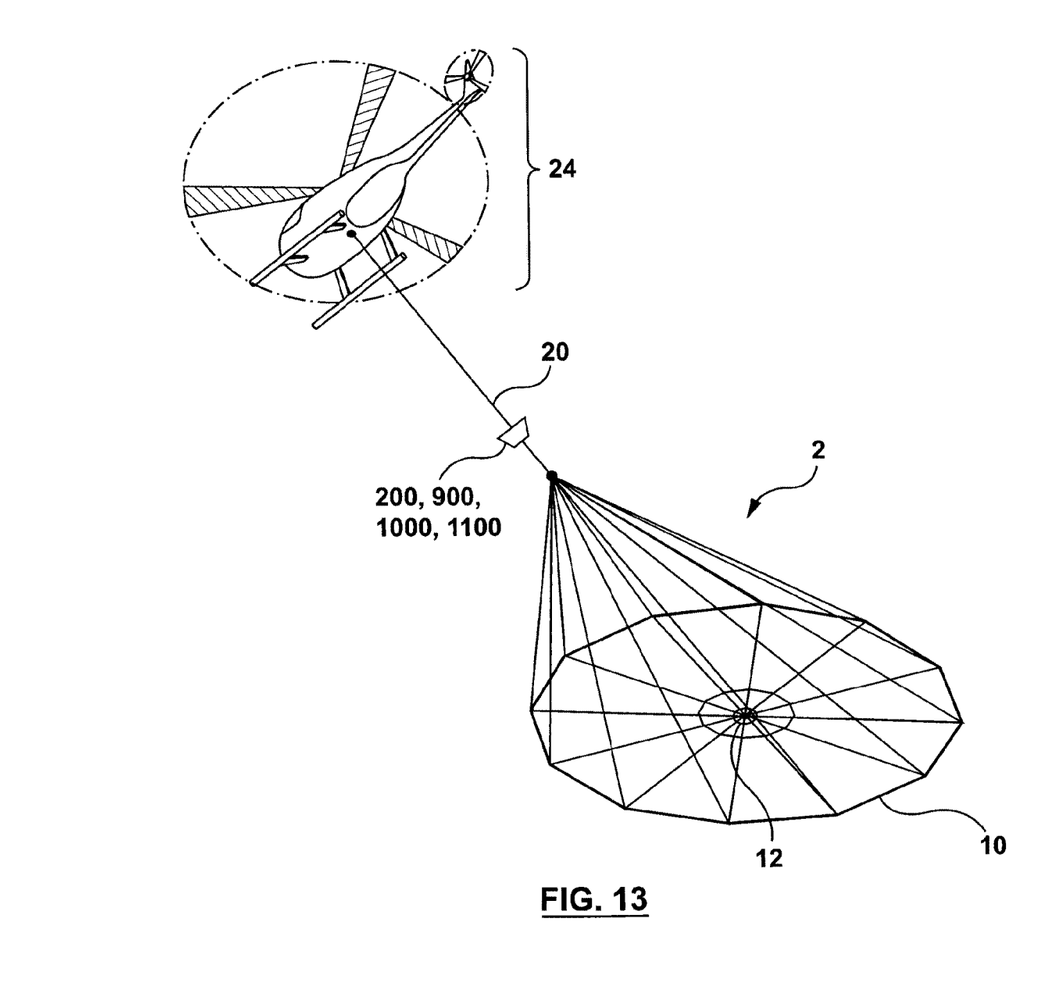
FIG. 13 shows an application of a magnetometer in an airborne surveying system.

In some airborne applications, magnetometers are used in combination with time domain electromagnetic surveying systems. By way of example, FIG. 13 illustrates kicker pulse enabled magnetometer 200, 900, 1000, or 1100 connected to a tow rope 20 and suspended from a survey aircraft 24 that is a helicopter. The tow rope 20 also supports TDEM surveying system (for example the VTEM™ system flown by Geotech™) in which a large transmitter loop 10 is pulsed on and off in order to generate a primary signal such that the resulting secondary signal from the survey terrain is measured by a receiver coil 12. Accordingly, the transmitter coil configuration shown in FIG. 12 simulates a possible real world environment in which the magnetometer 100' may operate, namely an environment where the magnetometer 100' is repeatedly subjected to a large transmitted EM pulse that drives it into a dead zone from which it must quickly recover so that measurements can be made during an off duration of the large EM pulse. In some embodiments, magnetometer 200 may be flown without a TDEM surveying system, and may be secured to an aircraft by means other than a tow rope, including mounted to the aircraft by a stinger or other mounting system.

In the test setup of FIG. 12, pulse 224 was provided to the Helmholtz coil 222 when the transmitter coil 1210 was turned off in order to reduce the time period required for the magnetometer 100' to recover from the dead zone.

In an example embodiment, the pulse 224 was selected to have a pulse width of 2 microseconds, an amplitude of 10V and was sent 100 microseconds after the transmitter coil 1210 is turned off. In some example embodiments, the kicker pulse 224 was applied to Helmholtz coil 222 at 500 microseconds after the transmitter coil 1210 is turned off. In example embodiments, the transmitter coil 1210 was pulsed at a 70 Hz frequency with a 50% duty cycle. The results of the test setup are similar to what is shown in FIGS. 3-6 as described above.

As noted above the kicker pulse 224 is of short duration, and in some example embodiments is less than ½ the cycle of the expected Larmor frequency. This is because the spectrum of the pulse is related to the Dirac delta function and hence must be short to provide the desired power spectrum while at the same time not interfering with oscillation once it has started. In some embodiments the pulse may be wider, for example up to one cycle of expected Larmor frequency.

Figure 14:
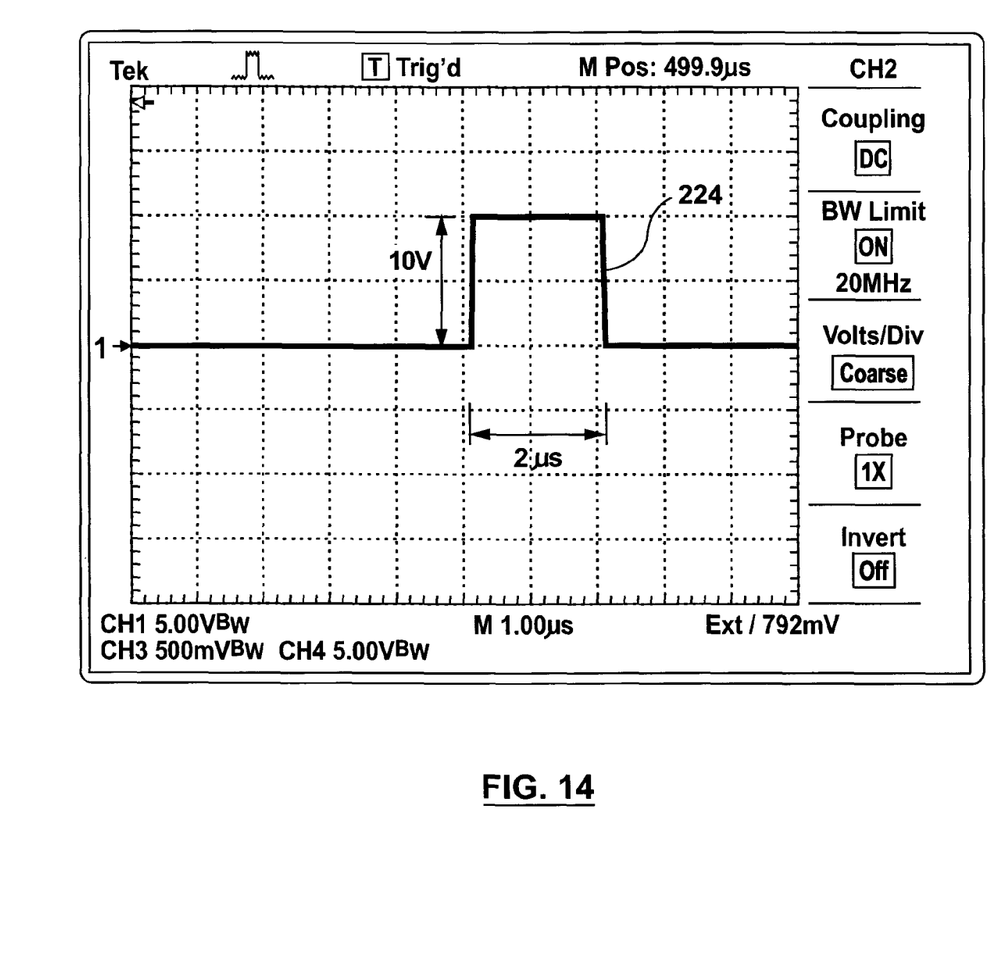
FIG. 14 is a screen shot of oscilloscope showing an example of a short kicker pulse according to example embodiments.

An oscilloscope screen showing an example of pulse 224 as generated by waveform generator 1202 in the absence of Helmholtz coil 222 is shown in FIG. 14. The width of the pulse is the distance between the rising and falling edge of the waveform as seen at the output of waveform generator 1202 without any load, which as shown in FIG. 14 is 2 microseconds, with a 10 Volt peak to peak amplitude. The pulse 224 takes the form shown in FIG. 5 when applied to Helmholtz coil 222. In different examples, the width of the pulse 224 as applied to a Helmholtz coil 222 having 10 turns was varied between 1.54 microseconds and 4 microseconds. Oscillation was initiated and successfully maintained with the pulse width set at each of at least the following: 1.54 microseconds, 1.67 microseconds, 1.8 microseconds, 2 microseconds, 2.2 microseconds, 2.5 microseconds, 2.86 microseconds and 3.33 microseconds.

In different examples the number of turns in the Helmholtz coil 222 was changed from 10 to change the strength of the applied magnetic field. In one example, a 2 microsecond pulse 224 was applied to a coil with 3 turns; in another example, a 2 microsecond pulse 224 was applied to a coil with 5 turns; in another example a 2 microsecond pulse 224 was applied to a coil with 10 turns. The magnetic field generated in the above example varied accordingly from $1.69 \times 10^{-5}$ tesla to $5.62 \times 10^{-5}$ tesla, with the greatest number of turns (10) resulting in the quickest self-oscillation start time.

The direction of the current in the Helmholtz coil 222 was reversed in different examples. In one current direction, self-oscillation started with an upward slope. In the opposite current direction, self-oscillation started with a downward slope.

In example embodiments, the time duration between when a 2 microsecond kicker pulse 224 was applied to Helmholtz coil 222 and the transmitter coil 1210 was turned off was varied from approximately 100 microseconds to 1000 microseconds with self-oscillation being successfully triggered. At least some delay following the off transition of the transmitter coil is required to allow sufficient decay of the residual current in the transmitter coil.

Certain adaptations and modifications of the described embodiments can be made. Therefore, the above discussed embodiments are considered to be illustrative and not restrictive.

What is claimed is:

1. A method for a self-oscillating magnetometer, comprising:
   injecting light into a vapor cell;
   detecting an output of the light from the vapor cell;
   modulating the light injected into the vapor cell in dependence on the detected output to achieve an oscillating signal;
   applying an energy pulse to the vapor cell prior to achieving the oscillating signal to cause self-oscillation to begin within a duration that corresponds to one cycle of the oscillating signal; and
   determining a magnetic field measurement in dependence on a frequency of the oscillating signal.

2. The method of claim 1 wherein the energy pulse has a duration that is less than an anticipated duration of one cycle of the oscillating signal.

3. The method of claim 1 wherein the energy pulse has a duration that is less than one half of an anticipated duration of one cycle of the oscillating signal.

4. The method of claim 1 wherein the energy pulse has a broad band power spectrum that covers all possible operating frequencies of the oscillating signal.

5. The method of claim 1 wherein modulating the light comprises applying an RF signal through an electrical coil to the vapor cell at a Larmor frequency.

6. The method of claim 5 wherein applying the energy pulse to the vapor cell comprises applying the energy pulse through a further electrical coil to the vapor cell.

7. The method of claim 5 wherein applying the energy pulse to the vapor cell comprises applying the energy pulse through the same electrical coil as the RF signal.

8. The method of claim 1 wherein modulating the light comprises applying an optical signal using a light source to the vapor cell at a Larmor frequency.

9. The method of claim 8 wherein applying the energy pulse to the vapor cell comprises applying the energy pulse through the light source or a further light source to the vapor cell.

10. The method of claim 8 wherein applying the energy pulse to the vapor cell comprising applying the energy pulse through an electrical coil to the vapor cell.

11. The method of claim 1 wherein the injecting, detecting, modulating, applying and determining are all implemented by magnetometer system that is supported by an aircraft, wherein applying the energy pulse is triggered by detecting when a periodic EM signal has entered an off state.

12. A self-oscillating magnetometer apparatus comprising:
   a vapor cell containing an alkali vapor
   a light source for injecting light into the vapor cell;
   a detector for detecting an output of the light from the vapor cell;
   a modulating device for modulating the light injected into the vapor cell in dependence on the detected output to achieve an oscillating signal; and
   a driver for applying an energy pulse to the vapor cell prior to achieving the oscillating signal to cause self-oscillation to begin within a duration that corresponds to one cycle of the oscillating signal;
   wherein a magnetic field measurement is represented by a frequency of the oscillating signal.

13. The apparatus of claim 12 wherein the energy pulse has a duration that is less than an anticipated duration of one cycle of the oscillating signal.

14. The apparatus of claim 12 wherein the energy pulse has a duration that is less than one half of an anticipated duration of one cycle of the oscillating signal.

15. The apparatus of claim 12 wherein the energy pulse has a broad band power spectrum that covers all possible operating frequencies of the oscillating signal.

16. The apparatus of claim 12 comprising an electrical coil that is connected to the driver for applying the energy pulse to the vapor cell as an RF signal.

17. The apparatus of claim 16 wherein the electrical coil is part of the modulating device.

18. The apparatus of claim 16 wherein the modulating device comprises a further electrical coil for applying a depolarizing signal to the vapor cell.

19. The apparatus of claim 16 wherein the modulating device comprises a further light source for applying a depolarizing signal to the vapor cell.

20. The apparatus of claim 12 comprising a further light source that is connected to the driver for applying the energy pulse to the vapor cell as a light signal.

21. The apparatus of claim 12 wherein the light source is part of the modulating device.

22. The apparatus of claim 12 including:
   an airborne surveying system that comprises a transmitter coil for generating a periodic EM signal having an on state and off state;
   a switch that causes the driver to apply the energy pulse after the periodic EM signal enters an off state.

* * * * *